United States Patent
Audet et al.

(10) Patent No.: US 9,553,079 B1
(45) Date of Patent: Jan. 24, 2017

(54) FLIP CHIP ASSEMBLY WITH CONNECTED COMPONENT

(71) Applicant: International Business Machines Corporation, Armonk, NY (US)

(72) Inventors: Jean Audet, Quebec (CA); Luc G. Guerin, Quebec (CA); Richard Langlois, Quebec (CA); Stephan L. Martel, Quebec (CA); Sylvain E. Ouimet, Quebec (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/969,765

(22) Filed: Dec. 15, 2015

(51) Int. Cl.
| | |
|---|---|
| *H01L 21/00* | (2006.01) |
| *H01L 25/16* | (2006.01) |
| *H01L 23/00* | (2006.01) |
| *H01L 21/56* | (2006.01) |
| *H01L 23/498* | (2006.01) |
| *H01L 49/02* | (2006.01) |

(52) U.S. Cl.
CPC ............. *H01L 25/16* (2013.01); *H01L 21/563* (2013.01); *H01L 23/49816* (2013.01); *H01L 24/17* (2013.01); *H01L 24/81* (2013.01); *H01L 28/40* (2013.01); *H01L 2224/81815* (2013.01)

(58) Field of Classification Search
CPC ........... H01L 2224/81815; H01L 28/40; H01L 24/17; H01L 24/81; H01L 25/16
See application file for complete search history.

(56) References Cited

U.S. PATENT DOCUMENTS

| | | | | |
|---|---|---|---|---|
| 6,137,693 A | * | 10/2000 | Schwiebert | H01L 23/057 228/180.1 |
| 7,696,006 B1 | | 4/2010 | Hoang et al. | |
| 7,791,192 B1 | * | 9/2010 | Joshi | H01L 23/04 257/499 |
| 7,968,375 B1 | | 6/2011 | Rahman et al. | |

(Continued)

FOREIGN PATENT DOCUMENTS

KR    1020120088013 A    8/2012

OTHER PUBLICATIONS

B.Dang, et al.,"3D Chip Stack with Integrated Decoupling Capacitors", IEEE, Electronic Components and Technology Conference, 2009, p. 1-5.

(Continued)

*Primary Examiner* — A. Sefer
(74) *Attorney, Agent, or Firm* — Cantor Colburn LLP; Steven Meyers

(57) ABSTRACT

A flip chip assembly is disclosed that includes a die with die circuitry and a plurality of electrical contacts electrically connected to the die circuitry. A substrate includes electrical contacts that are juxtaposed with and electrically connected to corresponding die electrical contacts. A passive component is disposed between the die and the substrate, and includes a dielectric disposed between a first electrode and a second electrode. The first electrode is electrically connected to a first of the die electrical contacts and a corresponding substrate electrical contact, and the second electrode is electrically connected to a second of the die electrical contacts and a corresponding substrate electrical contact.

5 Claims, 6 Drawing Sheets

(56) References Cited

U.S. PATENT DOCUMENTS

| | | | |
|---|---|---|---|
| 7,973,383 B2 | 7/2011 | Furumiya et al. | |
| 2004/0012085 A1* | 1/2004 | Shioga | H01L 23/3107 257/723 |
| 2005/0218516 A1* | 10/2005 | Lloyd | H01L 23/62 257/738 |
| 2007/0205253 A1* | 9/2007 | Hubner | B23K 1/0016 228/193 |
| 2008/0225503 A1* | 9/2008 | Wollmann | H05K 1/023 361/782 |
| 2013/0078764 A1* | 3/2013 | Yamazaki | H01L 23/4985 438/107 |
| 2014/0185264 A1 | 7/2014 | Chen et al. | |

OTHER PUBLICATIONS

Y. Min, et al., "Embedded Capacitors in the Next Generation Processor", IEEE, Electronic Components & Technology Conference, 2013, pp. 1-5.

* cited by examiner

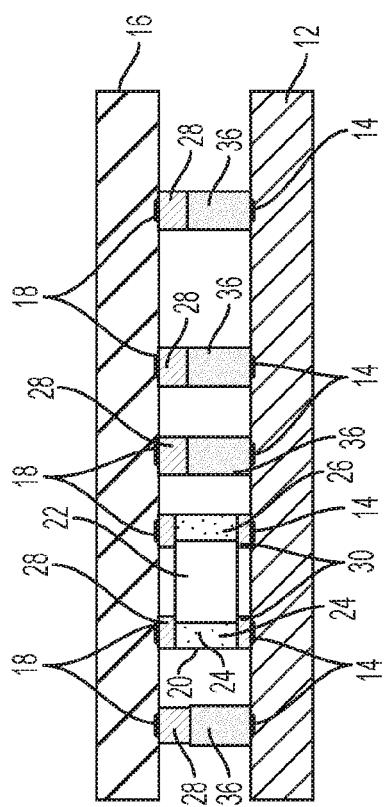
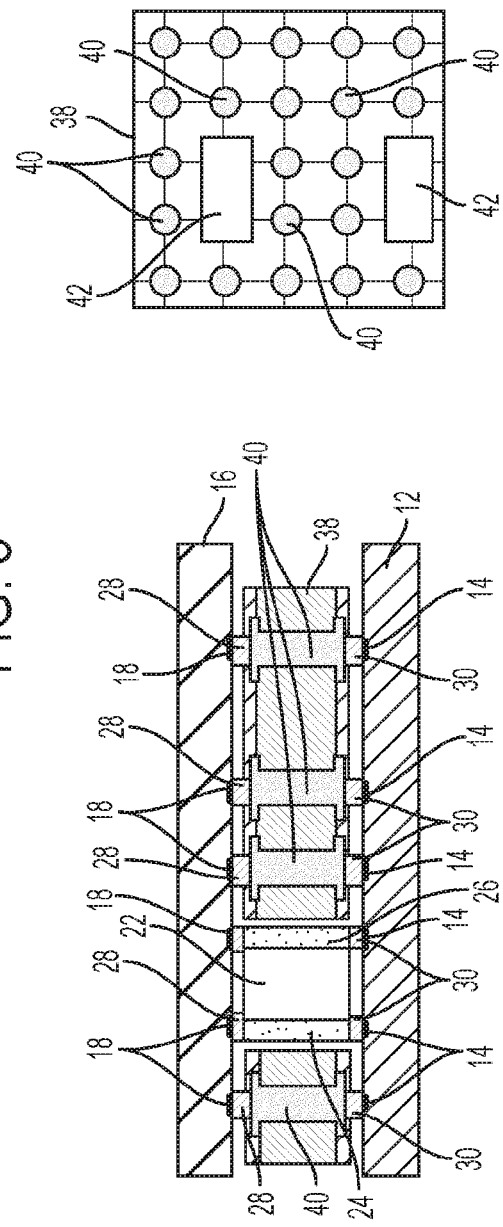

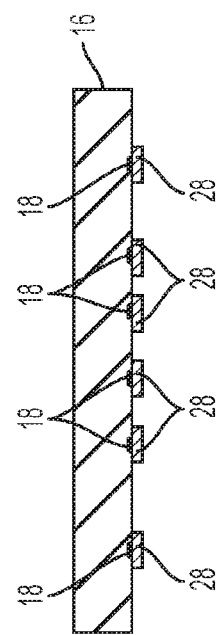
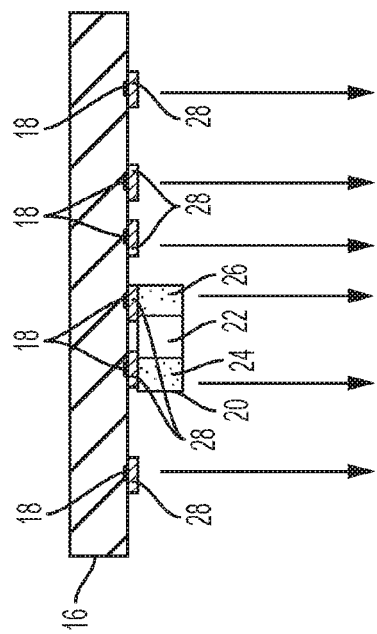
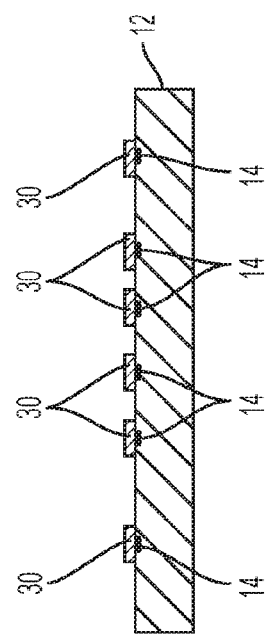
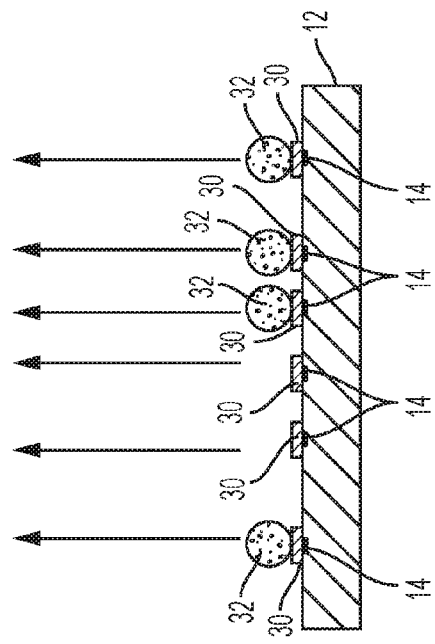

FLIP CHIP ASSEMBLY WITH CONNECTED COMPONENT

BACKGROUND

The present invention relates to circuitry devices, and more specifically, to devices with on-board components.

Circuitry incorporated into various integrated circuitry devices such as processor or other logic chips often requires stable power with minimal fluctuations. Capacitors can be used to reduce power fluctuations by storing electrical charge during periods of peak voltage and releasing it during periods of reduced voltage. Capacitors used for this purpose are often referred to as decoupling capacitors. Other passive components, such as resistors or inductors are also used in conjunction with chip circuitry for various purposes.

Various approaches have been tried for decoupling capacitors. For example, discrete capacitors can be mounted on at various locations on chip packages with wired connections to chip circuitry. Deep trench capacitors utilizing silicon on insulator (SOI) technology can be disposed on silicon interposers assembled under the chip. Alternatively, deep trench capacitors utilizing SOI technology can be embedded in the chip itself. These approaches and others each have their respective advantages and disadvantages, and the development of technology to address the issue of power stabilization and other issues that can be addressed by passive components continues to be pursued.

SUMMARY

According to an embodiment of the invention, a method of making a flip chip assembly comprises depositing solder bumps on a plurality of electrical contacts on a die surface, or on a substrate surface, or on both the die surface and substrate surface. The die electrical contacts are electrically connected to die circuitry. A passive component comprising electrodes is disposed between the die and the substrate such that the electrodes are positioned adjacent to solder bumps. Heat is applied to reflow the solder, and solidifying the solder provides a connection between the passive component electrodes and the die and substrate electrical contacts.

In another embodiment, a method of making a flip chip assembly comprises depositing solder bumps on a plurality of electrical contacts on a die surface. The die electrical contacts are electrically connected to die circuitry. Solder bumps are deposited on a plurality of electrical contacts on a substrate. One or more capacitors comprising a dielectric between electrodes are disposed on the die surface such that the electrodes are on die solder bumps. Heat is applied to reflow the die solder bumps, and solidifying the solder provides a connection between the capacitor electrodes to the die electrical contacts. One or more conductive spacers are disposed on substrate solder bumps corresponding to die electrical contacts without a capacitor and heat is applied heat to reflow the substrate solder bumps. Solidifying the solder connects the conductive spacers to the substrate electrical contacts. The die is disposed adjacent to the spacer such that the capacitor electrodes on the die are adjacent to substrate solder bumps, and conductive spacers on the substrate are adjacent to die solder bumps. Heat is applied to reflow the solder, and solidifying the solder, provides a connection between the capacitor electrodes and the die and substrate electrical contacts, and a connection between the conductive spacers and the die and substrate electrical contacts.

In another embodiment, a flip chip assembly comprises a die comprising circuitry and a plurality of electrical contacts electrically connected to the die circuitry. A substrate comprises electrical contacts that are juxtaposed with and electrically connected to corresponding die electrical contacts. A passive component comprising first and second electrodes is disposed between the die and the substrate. The first electrode is electrically connected to a first of the die electrical contacts and a corresponding substrate electrical contact, and the second electrode is electrically connected to a second of the die electrical contacts and a corresponding substrate electrical contact.

In another embodiment, a flip chip assembly comprises a die comprising circuitry and a plurality of electrical contacts electrically connected to the die circuitry. A planar substrate comprises electrical contacts that are juxtaposed with and electrically connected to the die electrical contacts. A plurality of decoupling capacitors comprising a dielectric disposed between electrodes are disposed between the die and the substrate, and the electrodes are disposed between and electrically connected to juxtaposed die and substrate electrical contacts. A plurality of conductive spacers are disposed between disposed between and electrically connected to juxtaposed die and substrate electrical contacts that are not connected to decoupling capacitors.

In another embodiment, a flip chip assembly comprises a die comprising circuitry and a plurality of electrical contacts electrically connected to the die circuitry. A substrate comprises electrical contacts that are juxtaposed with and electrically connected by solder connection to the die electrical contacts. A plurality of decoupling capacitors comprising a dielectric disposed between electrodes are disposed between the die and the substrate, and the electrodes disposed between and electrically connected by solder connection to juxtaposed die and substrate electrical contacts. A plurality of conductive spacers are disposed between and electrically connected by solder connection to juxtaposed die and substrate electrical contacts that are not connected to decoupling capacitors.

BRIEF DESCRIPTION OF THE DRAWINGS

FIG. 3 schematically depicts another exemplary embodiment of a flip chip assembly as described herein.

FIG. 4A schematically depicts a side view of an exemplary embodiment of a flip chip assembly utilizing an interposer substrate as a conductive spacer as described herein; and FIG. 4B schematically depicts a top view of the interposer substrate conductive spacer.

FIG. 6 schematically depicts another exemplary configuration of capacitor connections on a flip chip assembly FIGS. 7A-7D schematically depict steps of an exemplary method for making a flip chip assembly, in which:

FIG. 7A depicts a die having solder bumps on electrical contacts;

FIG. 7B depicts a substrate having solder bumps on electrical contacts;

FIG. 7C depicts a die having an attached passive component; and

FIG. 7D depicts a substrate having attached conductive spacer elements.

DETAILED DESCRIPTION

Figure 1:
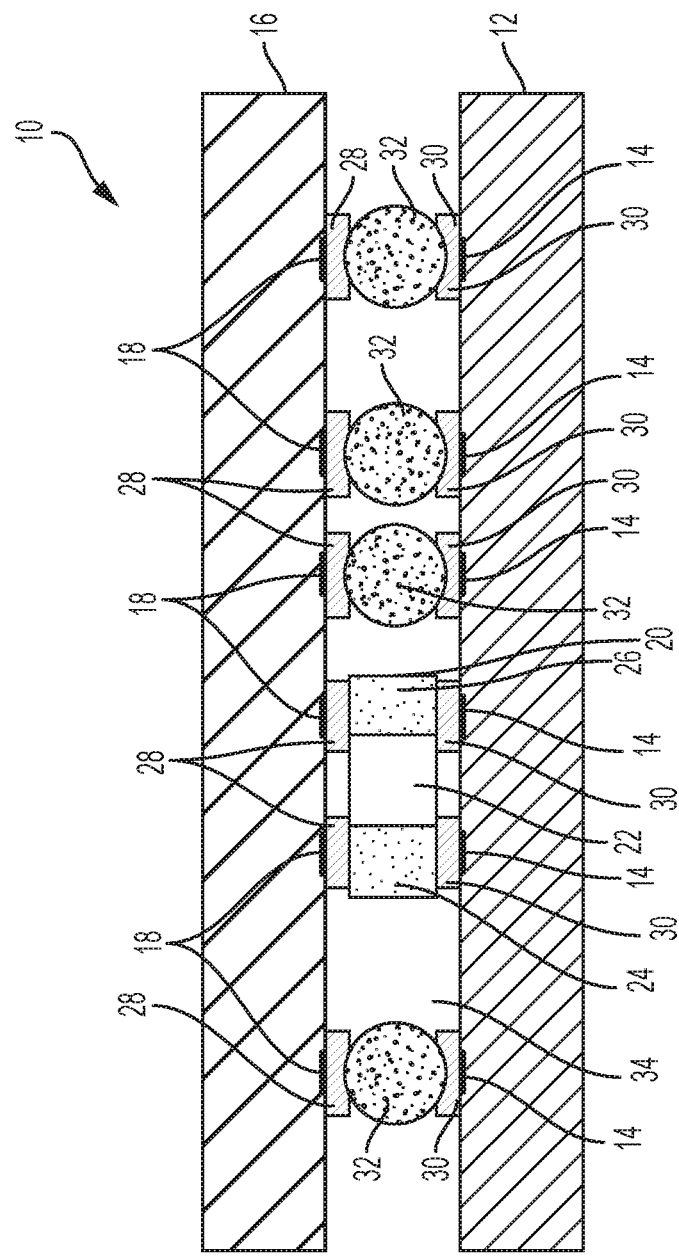
FIG. 1 schematically depicts an exemplary embodiment of a flip chip assembly as described herein.

With reference now to FIG. 1, an exemplary flip chip assembly 10 is schematically depicted. In the flip chip assembly 10, substrate 12 has substrate electrical contacts 14 disposed thereon. Although not required, in some embodiments, substrate 12 is planar. Substrate electrical contacts 14 can be formed by known substrate metallization techniques. The substrate 12 is itself electrically non-conductive, but substrate electrical contacts 14 are typically electrically connected to conductive metal vias (not shown) extending through the substrate 12 to connectors (not shown) for attachment to electronic components such as a printed circuit board, e.g., a computer motherboard. Die 16 has die electrical contacts 18 disposed thereon. The die electrical contacts 18 are typically electrically connected to chip circuitry (not shown). In some embodiments, the term "circuitry" can mean functionally operative component chip circuitry. Examples of functionally operative circuitry typically include operative semiconductor circuitry such as processor circuitry and memory circuitry, but can also include other functionally operative circuitry such as detector arrays, passive filters, microelectromechanical systems (MEMS), or nanoelectromechanical systems (NEMS). In some embodiments, the die is a semiconductor microprocessor chip, or an application specific integrated circuit (ASIC), or graphic processing unit (GPU).

Figure 2:
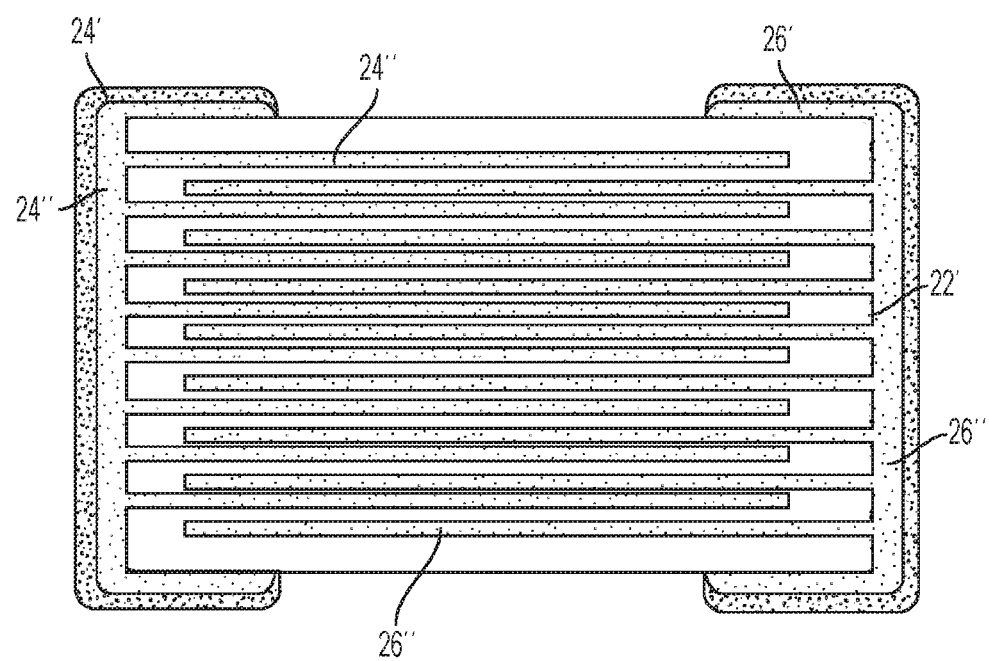
FIG. 2 schematically depicts an exemplary embodiment of a capacitor in greater detail.

As shown in FIG. 1, a passive component 20 comprises a passive functional element 22 disposed between a first electrode 24 and a second electrode 26. Any type of passive component can be utilized. Examples of passive components for inclusion in a C4 (controlled collapse chip connection) between a substrate and a chip (die) can include but are not limited to capacitors, inductors, and resistors. A depiction of a representative passive component in the form of a capacitor is set forth in FIG. 2, where external first electrode 24' is electrically connected to a stack of internal electrodes 24", and second external electrode 26' is electrically connected to a stack of internal electrodes 26". The stacked internal electrodes 24" and 26" are arranged in alternating order in the stack, separated from one another by dielectric material 22'.

With reference again to FIG. 1, the passive component electrodes 24, 26 are electrically connected to die contacts 18 (and therefore also electrically connected to the die circuitry (not shown)) through die solder connections 28. The passive component electrodes 24, 26 are also electrically connected to substrate contacts 14 through substrate solder connections 30, thereby establishing an electrical connection between die contacts 18 and substrate contacts 14 through the passive component electrodes 24, 26. Although not required in all embodiments, in some embodiments the positioning of a passive component 20 such as a capacitor immediately adjacent to the die 16 can provide significant performance advantages compared to other configurations where a capacitor is remote from the chip circuitry such as capacitors embedded in a substrate or between a substrate and an interposer substrate.

Conductive spacers, depicted in FIG. 1 as conductive metal balls 32, can optionally be disposed between other substrate contacts 14 and die contacts 18 where no passive component is present. The conductive metal balls are electrically connected to the die contacts 18 through die solder connections 28 and are electrically connected to substrate contacts 14 through substrate solder connections 30, thereby establishing an electrical connection between die contacts 18 and substrate contacts 14 through the conductive metal balls 32. A filler 34 such as a polymer resin underfill is disposed in the space between the substrate 12 and the die 16 and the other components discussed above. In some aspects, the die and substrate are separated by a dimension of less than or equal to 300 µm. In some aspects, the die and the substrate are separated by a dimension of less than or equal to 200 µm. In some aspects, the die has a thickness of less than or equal to 800 um. In some aspects, a passive component has a thickness of less than or equal to 250 µm (thickness being in a direction normal to the surface of the substrate and the die). In some aspects, a capacitor has a thickness of less than or equal to 250 µm (thickness being in a direction normal to the surface of the substrate and the die).

In an alternative embodiment as shown in FIG. 3, conductive spacers can be provided as conductive metal pillars 36 integrated with the substrate 14 and connected to the die contacts 18 through die solder connections 28. In another alternative embodiment as shown in FIG. 4A, conductive spacers can be provided with an interposer substrate 38 having conductive vias therethrough that are connected to the die contacts 18 through die solder connections 28 and are electrically connected to substrate contacts 14 through substrate solder connections 30, thereby establishing an electrical connection between die contacts 18 and substrate contacts 14 through the conductive vias 40. The interposer substrate is schematically depicted in a top view in FIG. 4B where open spaces 42 are provided for passive components 20. Examples of conductive metals for the conductive spacers, whether configured as balls, pillars, or vias in an interposer substrate, can include copper, aluminum, gold, silver, and other conductive metals. In some aspects, the thickness of the conductive spacer(s) is 100 µm to 150 µm (thickness being in a direction normal to the surface of the substrate and the die).

Figure 5:
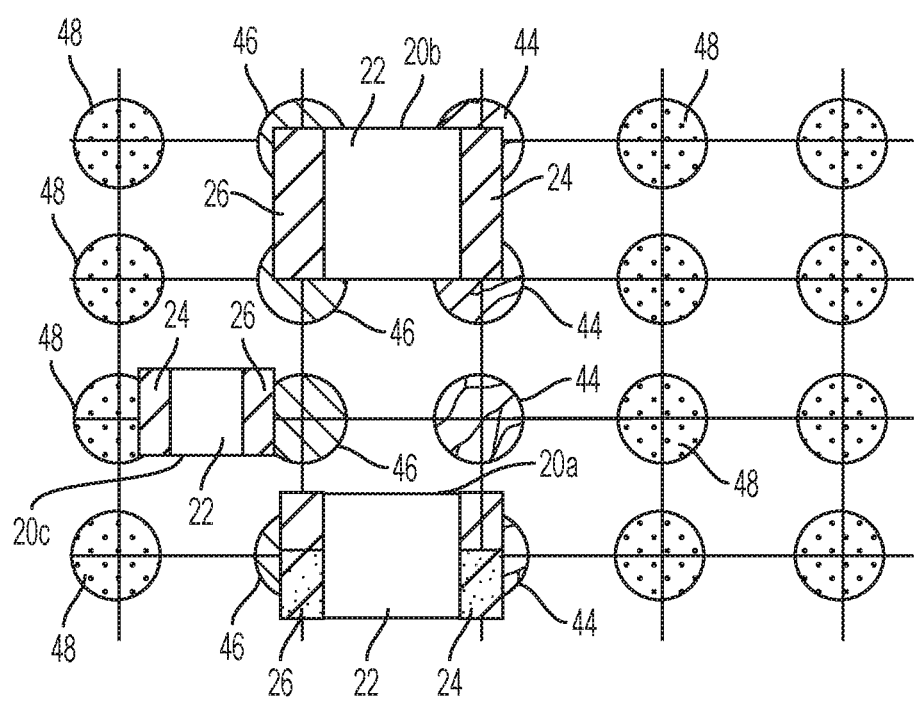
FIG. 5 schematically depicts an exemplary configuration of capacitor connections on a flip chip assembly.
Figure 6:
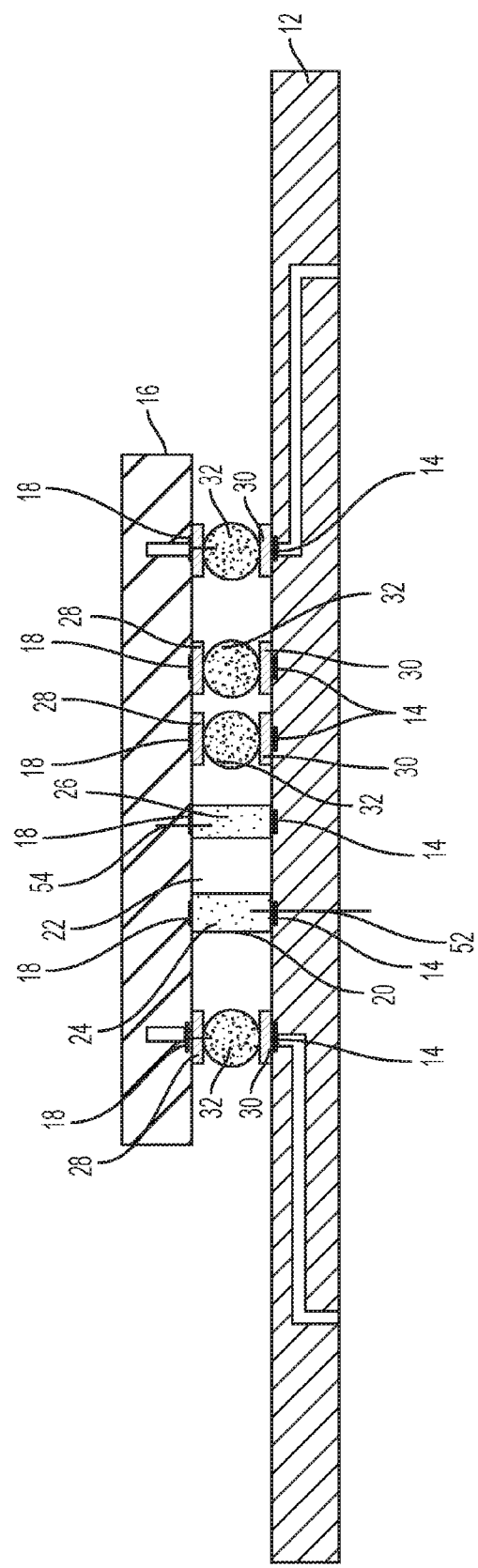

Passive components can be disposed in various connections with chip circuitry on the die. Several example configurations are depicted in FIG. 5 for decoupling capacitors, which depicts die contacts connected electrically connected to different types of circuitry: power circuit contacts 44, ground contacts 46, and signal circuit contacts 48. In some aspects, a decoupling capacitor can be connected to a pair of contacts, as depicted with capacitors 20a and 20c. In some embodiments, each of the electrodes of a passive component can be connected to a plurality of electrical contacts. For example, in some aspects a decoupling capacitor can be connected to a larger number of contacts, e.g., four contacts (two pair) as shown for capacitor 20b, or even more contacts depending on the design requirements of the circuitry and the specifications of the capacitor. In some aspects, capacitors can be disposed between power circuit contacts 44 and ground contacts 46 as shown for capacitors 20a and 20b. In some aspects, capacitors can be disposed between signal circuit contacts 48 and ground contacts 46 as shown for capacitor 20c. In another embodiment as shown in FIG. 6, a passive component 20 such as a capacitor, an inductor, or a resistor is connected in a serial arrangement in a signal circuit wherein the passive component first electrode is connected to a substrate electrical contact 14 connected to the serial circuit through electrical connection 52, and the passive component second electrode is connected to a die electrical contact 18 connected to the same serial circuit through electrical connection 54.

Additionally, embodiments of the invention have been described above utilizing a single or a small number of passive components and/or a small number of substrate-die connections without a passive component. Although such embodiments are of course within the scope of the invention, many other embodiments are of course contemplated, such as chips where large numbers of passive components and non-passive component connections (e.g., thousands) can be utilized on a single flip chip assembly.

In some embodiments, the flip chip assembly can be made by a method as depicted in FIGS. 7A-7D. As shown in FIG. 7A, die solder bumps 28 are deposited onto die electrical contacts 18 disposed on die 16. Solder bumps can be applied by any of a variety of techniques, for example by printing through a mask, or plating. As shown in FIG. 7B, substrate solder bumps 30 are deposited onto substrate electrical contacts 14 disposed on substrate 14. As shown in FIG. 7C, electrodes 24, 26 of a passive component 20 are disposed on identified die solder bumps 28, heat is applied to reflow the solder, and the solder is solidified to connect the passive component electrodes 24, 26 to the die contacts 18. As shown in FIG. 7D, conductive metal balls 32 are disposed on identified substrate solder bumps 30, heat is applied to reflow the solder, and the solder is solidified to connect the conductive metal balls 32 to the substrate contacts 14. The die 16 and substrate 12 are brought into a juxtaposed position as indicated by the arrows between FIGS. 7C and 7D, with the conductive metal balls 32 in contact with specified die solder bumps 28, and the passive component electrodes 24, 26 in contact with specified substrate solder bumps 32. Heat is applied to reflow the solder. Solidification of the solder results in a connection between the passive component electrodes and the die and substrate electrical contacts, and a connection between the conductive spacers and the die and substrate electrical contacts.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a flip chip assembly, comprising:
depositing solder bumps on a plurality of electrical contacts on a die surface, or on a substrate surface, or on both the die surface and substrate surface, the die electrical contacts electrically connected to die circuitry;
disposing between the die and the substrate a passive component comprising electrodes positioned adjacent to solder bumps;
applying heat to reflow the solder;
solidifying the solder, thereby providing a connection between the passive component electrodes and the die and substrate electrical contacts; and
disposing a conductive spacer between the die and substrate positioned between a die solder bump and a substrate solder bump.

2. The method of claim 1, wherein disposing the passive component between the die and the substrate comprises positioning the passive component electrodes on die solder bumps, applying heat to reflow the solder, solidifying the solder, and positioning the die and substrate with the passive component electrodes on substrate solder bumps.

3. The method of claim 1, wherein disposing the passive component between the die and the substrate comprises positioning the passive component electrodes on substrate solder bumps, applying heat to reflow the solder, solidifying the solder, and positioning the die and substrate with the passive component electrodes on die solder bumps.

4. The method of claim 1, further comprising depositing a filler material to underfill between the die and the substrate.

5. The method of claim 1, comprising
depositing solder bumps on a plurality of electrical contacts on a die surface, the electrical contacts electrically connected to die circuitry;
depositing solder bumps on a plurality of electrical contacts on a substrate;
disposing one or more capacitors comprising a dielectric between electrodes such that the electrodes are on die solder bumps, applying heat to reflow the solder, and solidifying the solder to connect the capacitor electrodes to the die electrical contacts;
disposing one or more conductive spacers on substrate solder bumps corresponding to die electrical contacts without a capacitor, applying heat to reflow the solder, and solidifying the solder to connect the conductive spacers to the substrate electrical contacts;
disposing the die adjacent to the spacer such that the passive component electrodes on the die are adjacent to substrate solder bumps, and conductive spacers on the substrate are adjacent to die solder bumps, and applying heat to reflow the solder;
solidifying the solder, thereby providing a connection between the capacitor electrodes and the die and substrate electrical contacts, and a connection between the conductive spacers and the die and substrate electrical contacts; and
depositing a filler material to underfill between the die and the substrate.

* * * * *